(12) United States Patent
Kondou

(10) Patent No.: US 8,507,984 B2
(45) Date of Patent: Aug. 13, 2013

(54) SEMICONDUCTOR DEVICE LIMITING ELECTRICAL DISCHARGE OF CHARGE

(75) Inventor: Satoshi Kondou, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

(21) Appl. No.: 13/355,678

(22) Filed: Jan. 23, 2012

(65) Prior Publication Data

US 2012/0217581 A1    Aug. 30, 2012

(30) Foreign Application Priority Data

Feb. 24, 2011    (JP) .................. 2011-038012

(51) Int. Cl.
*H01L 29/76* (2006.01)
(52) U.S. Cl.
USPC .................. 257/337; 257/343; 257/E27.016
(58) Field of Classification Search
USPC .................. 257/337, 343, E27.016
See application file for complete search history.

(56) References Cited

U.S. PATENT DOCUMENTS

| 4,270,137 A * | 5/1981 | Coe ........................... 257/408 |
| 4,766,474 A * | 8/1988 | Nakagawa et al. ........... 257/409 |
| 7,719,076 B2 * | 5/2010 | Shu et al. ..................... 257/488 |
| 8,115,253 B2 * | 2/2012 | Tang et al. ................... 257/341 |
| 2003/0107081 A1 * | 6/2003 | Lee et al. ..................... 257/344 |

FOREIGN PATENT DOCUMENTS

JP    2-16021    4/1990

* cited by examiner

*Primary Examiner* — Andy Huynh
(74) *Attorney, Agent, or Firm* — Oblon, Spivak, McClelland, Maier & Neustadt, L.L.P.

(57) ABSTRACT

A semiconductor device includes a source region embedded in the surface of the second semiconductor region, a drain region embedded in the surface of the first semiconductor region separated from the second semiconductor region, a gate electrode located on the second semiconductor region, an insulation film located on the first semiconductor region between the second semiconductor region and the drain region, a voltage dividing element dividing the voltage between the gate electrode and the drain region, and a charge transfer limiting element limiting transfer of charge from the voltage dividing element to the drain region.

6 Claims, 9 Drawing Sheets

SEMICONDUCTOR DEVICE LIMITING ELECTRICAL DISCHARGE OF CHARGE

CROSS REFERENCE TO RELATED APPLICATIONS AND INCORPORATION BY REFERENCE

This application is based upon and claims the benefit of priority from prior Japanese Patent Application P2011-038012 filed on Feb. 24, 2011; the entire contents of which are incorporated by reference herein.

BACKGROUND OF THE INVENTION

1. Field of the Invention

The present invention relates to a semiconductor device having a lateral transistor.

2. Description of the Related Art

As a high-voltage switching element, a lateral transistor is used which has a structure for alleviating electricity field intensity between a gate electrode and a drain region. Laterally Diffused MOS (LDMOS) transistors and High Electron Mobility Transistor (HEMT) are known as a kind of the lateral transistor. For example, when an AC-DC converter is made of a single chip, a high-voltage LDMOS transistor is used as a power MOS transistor.

In order to suppress fluctuation of electrical properties of a LDMOS transistor such as voltage resistance and on resistance, a structure has been proposed in which a field plate is located on an insulation film between a gate electrode and a drain region. The objective of the structure is to realize a highly reliable high-voltage MOS transistor that is not affected by external charge by covering an insulation film between a gate electrode and a drain region with a floating conductive body and locating a field plate thereon.

There is a problem in a LDMOS transistor in that, although a channel is formed in a semiconductor layer beneath a gate electrode in an on state and current flows between a drain electrode and a source electrode, on resistance becomes high due to resistance of the semiconductor layer between a gate electrode and a drain region.

SUMMARY OF THE INVENTION

An aspect of the present invention is a semiconductor device. The semiconductor device includes a second conductive type first semiconductor region; a first conductive type second semiconductor region embedded in a part of an upper surface of the first semiconductor region; a second conductive type source region embedded in a part of an upper surface of the second semiconductor region; a second conductive type drain region embedded in a part of the upper surface of the first semiconductor region separated from the second semiconductor region; a gate electrode located on the second semiconductor region between the source region and the drain region; an insulation film located on the first semiconductor region between the second semiconductor region and the drain region; a voltage dividing element which is located on the insulation film and configured to divide a voltage between the gate electrode and the drain region; and a charge transfer limiting element connected between the voltage dividing element and the drain region and configured to limit transfer of charge from the voltage dividing element to the drain region.

Another aspect of the present invention is a semiconductor device. The semiconductor device includes a substrate; a source region provided in a part of an upper surface of the substrate; a drain region provided in a part of the upper surface of the substrate separated from the source region; a gate electrode located on the substrate between the source region and the drain region; an insulation film located on the upper surface of the substrate between the gate electrode and the drain region; a voltage dividing element which is located on the insulation film and configured to divide a voltage between the gate electrode and the drain region; and a charge transfer limiting element connected between the voltage dividing element and the drain region and configured to limit transfer of charge from the voltage dividing element to the drain region.

DETAILED DESCRIPTION OF THE INVENTION

Figure 1:
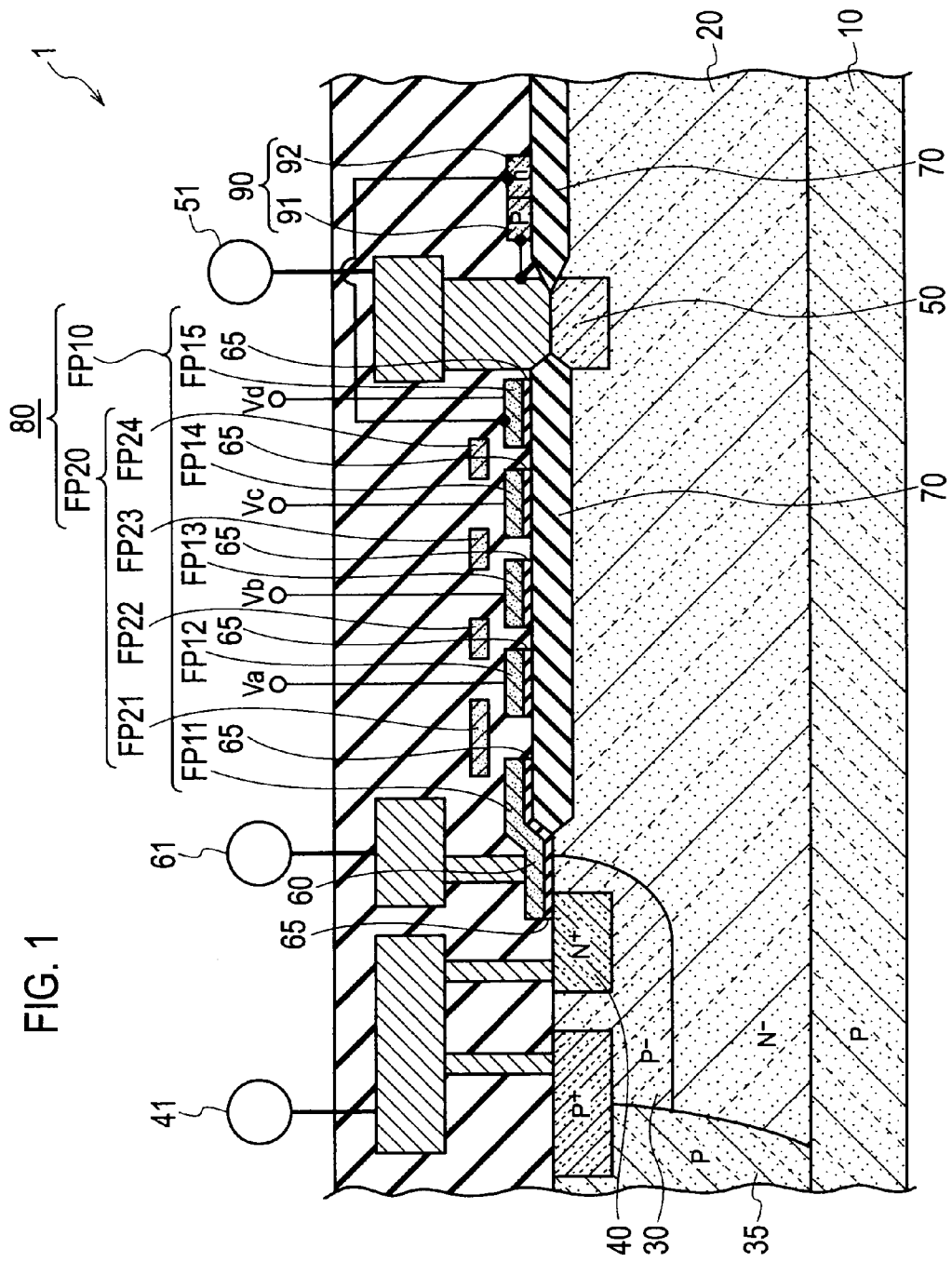
FIG. 1 is a schematic cross-sectional view showing a structure of a semiconductor device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

First Embodiment

As illustrated in FIG. 1, a semiconductor device 1 according to the first embodiment of the present invention is provided with a first conductive type semiconductor substrate 10, a second conductive type first semiconductor region (well) 20 arranged on the semiconductor substrate 10, a first conductive type second semiconductor region (well) 30 provided in a part of the upper surface of the first semiconductor region 20, a second conductive type source region 40 provided in a part of the upper surface of the second semiconductor region 30, a second conductive type drain region 50 provided in a part of the upper surface of the first semiconductor region 20 apart from the second semiconductor region 30, and a gate electrode 60 arranged on the second semiconductor region 30 between the source region 40 and the drain region 50. It is not necessary to form the first semiconductor region 20 when the second conductive type semiconductor substrate 10 is used. It may be considered as a substrate including the semiconductor substrate 10 and the first semiconductor region 20. In the first embodiment, the second semiconductor region 30, the source region 40 and the drain region 50 are the embedded regions.

Further, the semiconductor device 1 includes a field insulation film 70 such as a LOCOS oxide film arranged on the first semiconductor region 20 between the second semiconductor region 30 or the gate electrode 60 and drain region 50, a voltage dividing element 80 which is arranged on the field insulation film 70 and divides a voltage between the gate electrode 60 and the drain region 50, and a charge transfer limiting element 90 which suppresses transfer of charge from the voltage dividing element 80 to the drain region 50 during conduction between the source region 40 and the drain region 50. The voltage dividing element 80 applies divided voltages respectively to the surface of the first semiconductor region 20 directly beneath the field insulation film 70. The charge transfer limiting element 90 has the voltage dividing element 80 retain charge by limiting transfer of charge during conduction between the source region 40 and the drain region 50. The charge transfer limiting element 90 does not limit transfer of charge between the dividing element 80 and the drain region 50 when there is no conduction between the source region 40 and the drain region 50.

Note that the first conductive type and the second conductive type are opposite conductive types to each other. This means that, when the first conductive type is p type, the second conductive type is n type. Thus, the semiconductor device 1 is an n-type channel MOS transistor. When the first conductive type is n type, the second conductive type is p type. Thus, the semiconductor device 1 is a p-type MOS transistor. Description below is an exemplary case where the first conductive type is p type and the second conductive type is n type.

The voltage dividing element 80 shown in FIG. 1 includes a plurality of field plates FP1 to FP15 and FP21 to FP 24 separated from each other and arranged in the direction from the second semiconductor region 30 toward the drain region 50. Further, although details are described later, the voltage dividing element 80 is provided with charge retaining elements respectively formed between the neighboring field plates FP11 to FP15 and FP 21 to 24. The voltages present in the field plates FP12 to FP14 are represented as divided voltages Va to Vc. Also, the voltage Vd of the field plate FP15 is a voltage reduced by the charge transfer limiting element 90 from the drain voltage of the drain region 50.

Field plates FP11 to FP15 separated from each other on the upper surface of the field insulation film 70 form the first field plate row FP10. The field plates FP21 to FP24 separated from each other on the same plane above the first field plate row FP10 form the second field plate row PF20. The field plates FP21 to FP24 cover the gaps among the field plates FP11 to FP15 and also overlap the field plates FP11 to FP15 partially. In other words, the first field plate row FP10 and the second field plate row FP20 as a whole complementarily cover the entire upper surface of the field insulation film 70.

Figure 2:
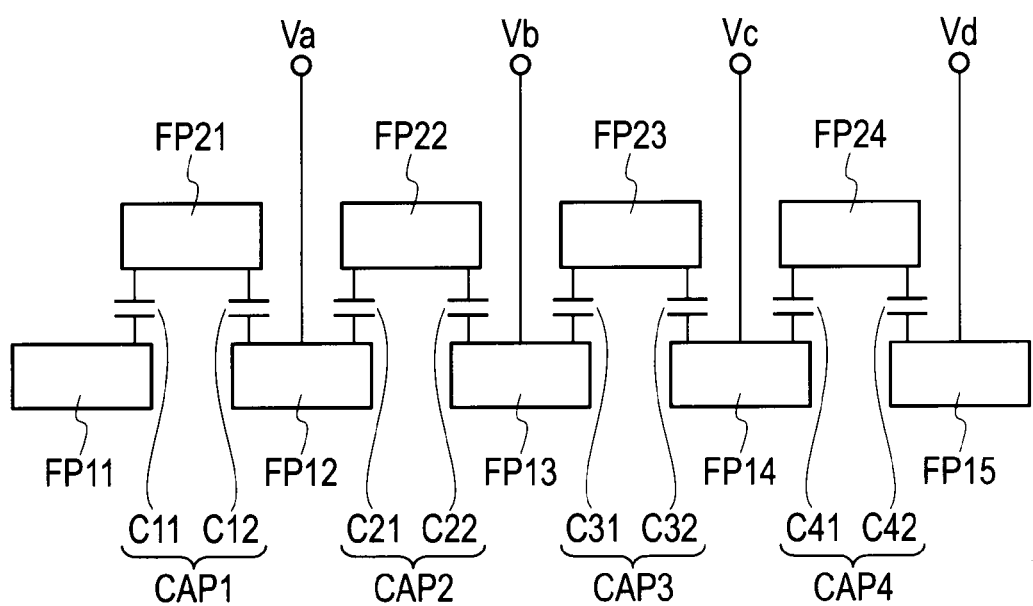
FIG. 2 is a schematic view showing an example of a voltage dividing element of the semiconductor device according to the first embodiment of the present invention.

As illustrated in FIG. 2, a capacitative element (hereinafter referred to as CAP1) is formed in which capacitative elements C11 and C12 are series connected through the field plate FP21 between the field plates FP11 and FP12. Similarly, a capacitative element (hereinafter referred to as CAP2) is formed in which capacitative elements C21 and C22 are series connected through the field plate FP22 between the field plates FP12 and FP13, and a capacitative element (hereinafter referred to as CAP3) is formed in which capacitative elements C31 and C32 are series connected through the field plate FP23 between the field plates FP13 and FP14. Further, a capacitative element (hereinafter referred to as CAP4) is formed in which capacitative elements C41 and C42 are series connected through the field plate FP24 between the field plates FP14 and FP15.

In the semiconductor device 1 shown in FIG. 1, the capacitative elements CAP1 to CAP4 are the charge retaining elements which are respectively formed between neighboring field plates of the first field plate row FP10 arranged on the upper surface of the field insulation film 70.

For the field plates FP11 to FP15 and FP21 to FP24, polysilicon films, for example, may be used. Note that one of or both of the field plate row FP10 and the field plate row FP20 may be formed of a metallic film.

Also, as shown in FIG. 1, a zener diode formed of a p-type semiconductor layer 91 and an n-type semiconductor layer 92 is located as the charge transfer limiting element 90 on the upper surface of the field insulation film 70. The anode electrode of the charge transfer limiting element 90 is electrically connected to the drain region 50, and the cathode electrode thereof is electrically connected to the voltage dividing element 80. The p-type semiconductor layer 91 and the n-type semiconductor layer 92 can be formed by, for example, doping a p-type impurity and an n-type impurity respectively into a polysilicon film.

In FIG. 1, the charge transfer limiting element 90 is arranged at a position which faces the voltage dividing element 80 via the drain region 50. However, the charge transfer limiting element 90 may be arranged in other locations. Having said that, it is not preferred to locate the voltage dividing element 80 and the charge transfer limiting element 90 side by side between the gate electrode 60 and the drain region 50 because the distance between gate electrode 60 and the drain region 50 becomes large.

As illustrated in FIG. 1, the charge transfer limiting element 90 is connected between the drain region 50 and the field plate FP15 which is the closest to the drain region 50 among the plurality of field plates which constitute the voltage dividing element 80. On the other hand, the gate electrode 60 is capacitative-coupled with the field plate FP11 which is closest to the gate electrode 60 among the plurality of field plates which constitute the voltage dividing element 80.

Also, the gate insulation film 65 is formed between the gate electrode 60 and the second semiconductor region 30. Although the gate insulation film 65 is also formed on the field insulation film 70, the gate insulation film 65 formed between each of the field plates FP11 to FP15 is removed when the first field plate row FP10 is formed.

In the semiconductor device 1, a source electrode terminal 41 electrically connected to the source region 40 also serves as a back gate electrode. Therefore, the second semiconductor region 30 and the semiconductor substrate 10 are electrically connected to each other due to a first conductive type embedded region 35 arranged from the top surface through to the bottom surface of the first semiconductor region 20. Also, the voltage resistance of the semiconductor device 1 is improved by locating the second semiconductor region 30 and the field insulation film 70 separated from each other.

Figure 3A:
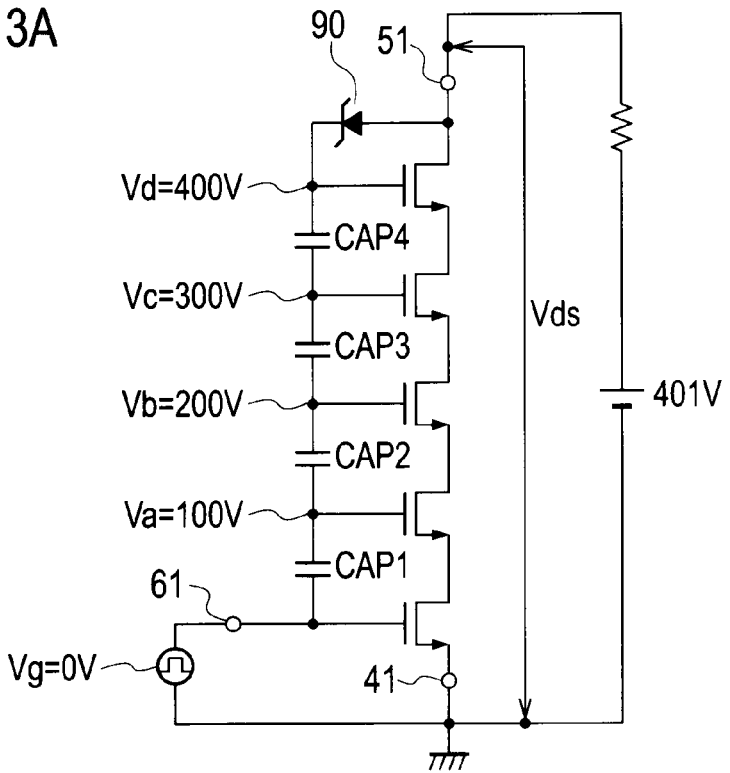
FIG. 3A is a schematic view showing an equivalent circuit when the semiconductor device shown in FIG. 1 is in an off state.
Figure 3B:
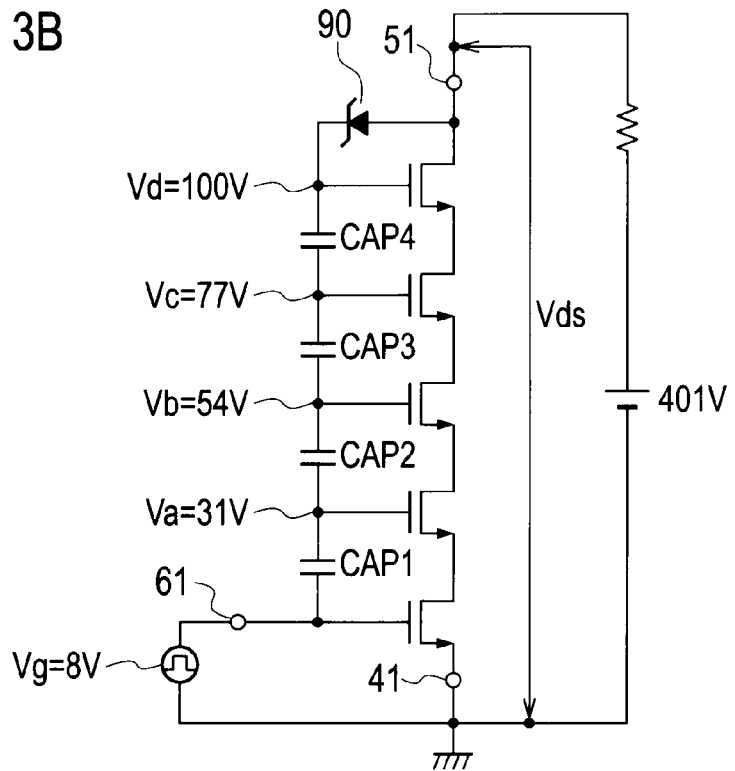
FIG. 3B is a schematic view showing an equivalent circuit when the semiconductor device shown in FIG. 1 is in an on state.

Next, exemplary operations of the semiconductor device 1 will be explained with reference to FIGS. 3A and 3B. The explanation below will be about a case where a voltage of 401V is applied between the source electrode terminal 41 and the drain electrode terminal 51 that is electrically connected to the drain region 50.

First, a case where the semiconductor device 1 in the off (no-conduction) state will be described. As illustrated in FIG. 3A, for example, a gate voltage Vg of 0V is applied between the gate electrode terminal 61 and the source electrode terminal 41.

At this time, charge is accumulated in the capacitive elements CAP1 to CAP4 between each of the field plates FP11 to FP15 which constitute the voltage dividing element 80. Here, the value of the voltage Vd of the field plate FP15 is a value obtained by reducing the voltage $V_{DS}$ between the drain electrode terminal 51 and the source electrode terminal 41 by the forward voltage Vf of the zener diode. If the forward voltage Vf is 1V, the voltage Vd of the field plate FP15 will be 400V. Then, divided voltages Va, Vb, and Vc are generated in the field plates FP12 to FP14, respectively, by dividing a voltage applied between the drain electrode terminal 51 and the source electrode terminal 41.

Here, it is assumed that the field plates FP11 to FP15 and FP21 to FP24 are arranged at regular intervals and the voltage between the gate electrode 60 and the field plate FP15 is divided equally. Hence, the divided voltage Vc is about 300V, the divided voltage Vb is about 200V, and the divided voltage Va is about 100V. The divided voltage Vc generated in the field plate FP14 and the voltage of the first semiconductor region 20 immediately beneath the field plate FP14 are almost equal (same for the divided voltages Va and Vb). Therefore, no channel is formed in the first semiconductor region 20 immediately beneath the field plate FP14.

Next, a case where the semiconductor device 1 is in an on (conduction) state will be explained. As illustrated in FIG. 3B, for example, a gate voltage Vg of 8V is applied between the gate electrode terminal 61 and the source electrode terminal 41. Thus, a cannel is created in the second semiconductor region 30 immediately beneath the gate electrode 60.

When the semiconductor device 1 is in the on state, since the drain electrode terminal 51 and the source electrode terminal 41 are in conduction state therebetween, the voltage $V_{DS}$ is 0V. Charge accumulated in the capacitive elements CAP1 to CAP4 are discharged to the drain region 50. However, since the zener diode is located as the charge transfer limiting element 90 between the voltage dividing element 80 and the drain region 50, the charge accumulated in the capacitative elements CAP1 to CAP4 are not completely discharged. This means that the voltage applied to the capacitative elements CAP1 to CAP4 is clamped. If the zener voltage of the zener diode which serves as the charge transfer limiting element 90 is 100V, the voltage Vd would be 100V. In other words, the charge is retained at the voltage dividing element 80 due to the charge transfer limiting element 90 and a constant amount of voltage is generated between the gate electrode 60 and the drain region 50.

Thus, the divided voltages Va, Vb, and Vc obtained by dividing the voltage between the field plate FP15 and the gate electrode 60 are generated in the field plates FP12 to FP14, respectively. When the voltage between the gate electrode 60 and the field plate FP15 is divided equally, the divided voltage Va is about 31V, the divided voltage Vb is about 54V, and the divided voltage Vc is about 77V.

As the divided voltages Va, Vb, Vc, and Vd are generated in the field plates FP12 to FP15, the voltages are applied to areas of the surface of the first semiconductor region 20 immediately beneath the field insulation film 70 which face the field plates FP12 to FP15. As a result, a channel is formed on the surface of the first semiconductor region 20 immediately beneath the field insulation film 70 between the gate electrode 60 and the drain region 50, thus decreasing the resistance.

Therefore, when the semiconductor device 1 is the on state, a current can flow more easily in the first semiconductor region 20 immediately beneath the field insulation film 70. In other words, the on resistance of the semiconductor device 1 is lowered.

Moreover, as the field plates FP11 to FP15 and FP21 to FP24 are located between the gate electrode 60 and the drain electrode terminal 51, electric field concentration in the drain-side end portion of the gate electrode 60 can be alleviated. Thus, the voltage resistance of the semiconductor device 1 is improved.

If the field plates are formed throughout the entire top surface of the field insulation film 70 as a continuous single film, a region which has a large potential difference from the field plate is generated in the first semiconductor region 20 which is located under the field plate, which could cause a breakage of the field insulation film 70. However, the first field plate row FP10 is divided into the field plates FP11 to FP15. Therefore, potential differences between the field plates FP11 to FP15 and areas of the first semiconductor region 20 which respectively face the field plates FP11 to FP15 via the field insulation film 70 are small. Hence, the field insulation film 70 is not broken so easily.

Furthermore, the field plates FP21 to FP24 are arranged so as to cover the gaps among the field plates FP11 to FP15 from above. This means that the first field plate row FP10 and the second field plate row FP20 as a whole complementarily cover the entire top surface of the field insulation film 70. Thus, an impurity penetrating from the top surface of the semiconductor device 1 can be prevented from reaching the field insulation film 70. Therefore, changes in properties and a decrease of reliability due to impurity penetration into the field insulation film 70 are limited.

Figure 4:
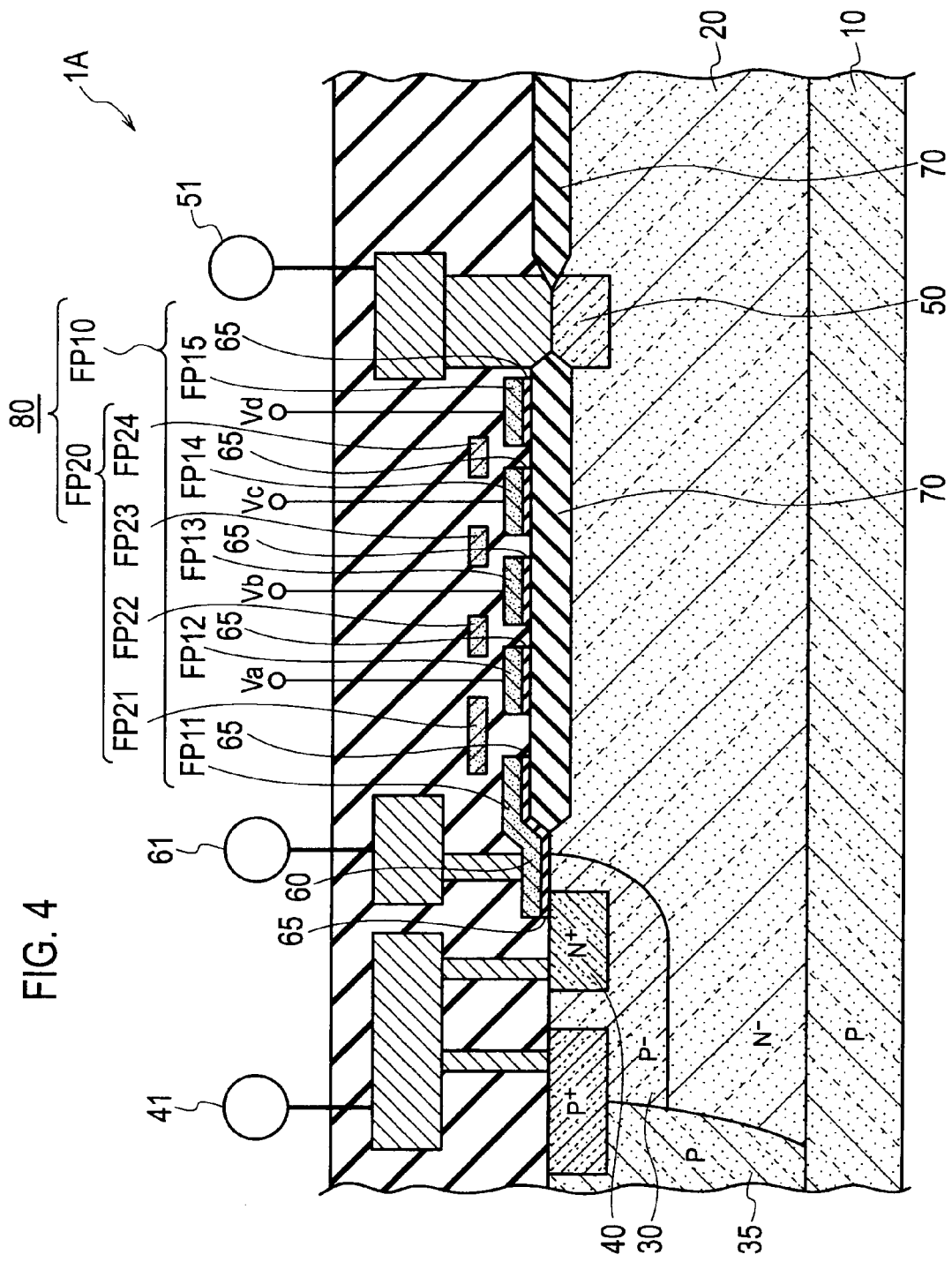
FIG. 4 is a schematic cross-sectional view showing a structure of a comparative example of the semiconductor device.
Figure 5A:
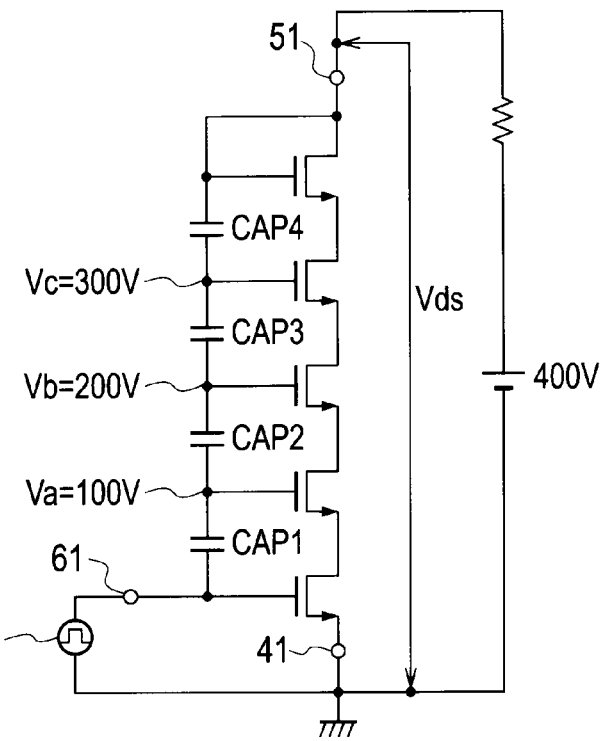
FIG. 5A is a schematic view showing an equivalent circuit when the semiconductor device shown in FIG. 4 is in the off state.

FIG. 4 shows an example of a semiconductor device 1A which is not provided with the charge transfer limiting element 90 as a comparative example of the semiconductor device 1 illustrated in FIG. 1. As shown in FIG. 5A, divided voltages Va to Vc of the semiconductor device 1A in an off state are the same as the divided voltages Va to Vc of the semiconductor device 1 shown in FIG. 3A. However, when the semiconductor device 1A enters in an on state, charge accumulated in field plates FP11 to FP15 and FP21 to FP24 are discharged since the charge transfer limiting element 90 is not provided therein.

Figure 5B:
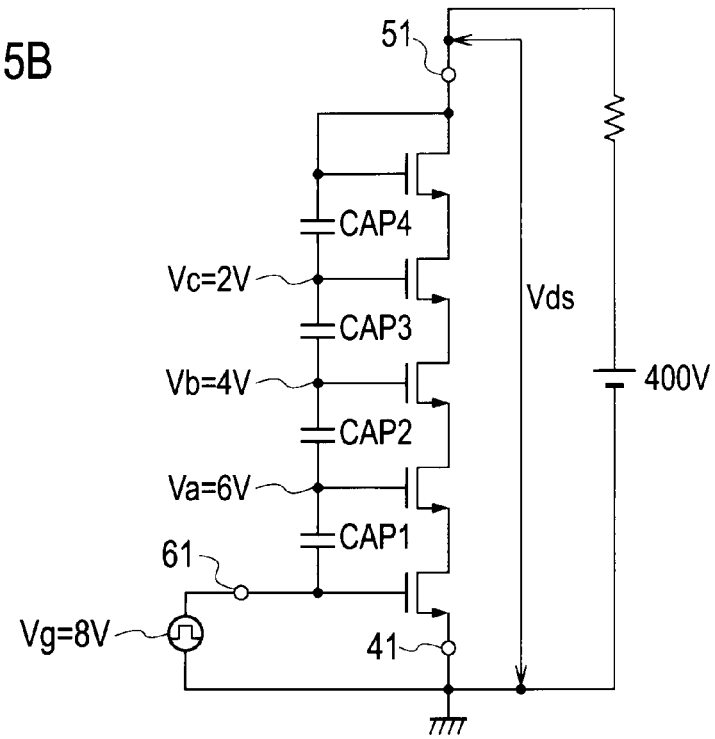
FIG. 5B is a schematic view showing the equivalent circuit when the semiconductor device shown in FIG. 4 is in the on state.

As shown in FIG. 5B, in the semiconductor device 1A, the divided voltages Va to Vc obtained by dividing the gate voltage Vg are also generated in the field plate FP12 to FP14 in the on state. However, in order to form a channel on the surface of a first semiconductor region 20 immediately beneath the field insulation film 70, the divided voltages Va to Vc need to be a certain value or higher. Typically, the voltage value required for forming a channel on the surface of the first semiconductor region 20 is, for example, about 10V or higher, although it depends on the film thickness of the field insulation film 70 and so forth.

Therefore, with the divided voltages Va to Vc obtained by dividing the gate voltage Vg of, for example, approximately 8V, no channel is formed on the surface of the first semiconductor region 20 immediately beneath the field insulation film 70. This means that, in the semiconductor device 1A shown in FIG. 4, since there is not the charge transfer limiting element 90 which limits transfer of charge from the field plates FP11 to FP15 and FP21 to FP24 during conduction between the source region 40 and the drain region 50, a channel is not crated on the surface of the first semiconductor region 20 immediately beneath the field insulation film 70.

Therefore, the on resistance of the semiconductor device 1A is determined by the cannel resistance of the gate electrode 60 and the resistance of the first semiconductor region 20. In the high-voltage LDMOS transistor in particular, the impurity concentration of the first semiconductor region 20 is set low, so the on resistance of the semiconductor device 1A becomes high.

By using a zener diode as the charge transfer limiting element 90, the voltage Vd of the field plate FP15 of the semiconductor device 1 shown in FIG. 1 becomes lower than the voltage Vd of the field plate FP15 of the semiconductor device 1A illustrated in FIG. 4 by a forward voltage Vf of the zener diode. However, the forward voltage Vf is small enough not to affect operations and reliability of the semiconductor device 1.

FIG. 1 shows the example where the three divided voltages Va to Vc are generated. However, the steps for voltage division and the values of the divided voltages, as well as the value of the voltage Vd and so forth are set in accordance with the voltage $V_{DS}$ between the drain electrode terminal 51 and the source electrode terminal 41, the film thickness of the field insulation film 70, and the like. For example, the number of steps for voltage division is set so as to generate divided voltages in 50V steps.

Also, if the zener voltage of the zener diode used as the charge transfer limiting element 90 is between 6V and 7V, a plurality of zener diodes are series-connected so that the voltage Vd becomes a predetermined voltage value.

As described so far, the semiconductor device 1 according to the first embodiment of the present invention is provided with the charge transfer limiting element 90 which has the voltage dividing element 80 retain charge by limiting electrical discharge of charge. Therefore, according to the semiconductor device 1, charge accumulated between the gate electrode 60 and the drain region 50 is not completely discharged when the high-voltage LDMOS transistor is in the on state, and a channel is formed on the surface of the first semiconductor region 20 immediately beneath the field insulation film 70. As a result, the resistance of the first semiconductor region 20 becomes smaller in the on state, thus decreasing the on resistance. Also, the electrical field concentration in the drain-side end portion of the gate electrode 60 is alleviated by the field plates FP11 to FP15 and FP21 to FP24. As a result, the semiconductor device 1 with high-voltage and low on resistance is achieved.

First Modification

In a state where the semiconductor device 1 is on and the source region 40 and the drain region 50 are electrically continuous therebetween thus being at the same electric potential, any elements other than the capacitative elements CAP1 to CAP4 may be used as the voltage dividing element 80 and any element other than a zener diode may be used as the charge transfer limiting element 90 as long as the object for retaining charge between the gate electrode 60 and the drain region 50 can be achieved.

Figure 6:
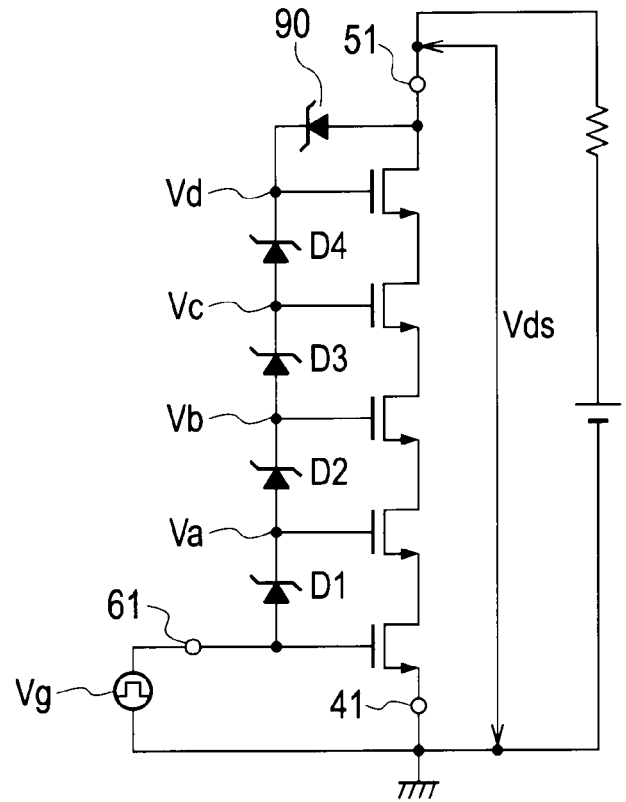
FIG. 6 is a schematic view showing an equivalent circuit of a semiconductor device according to the first modification of the first embodiment of the present invention.

For example, as illustrated in FIG. 6, zener diodes D1 to D4 may be located as the charge retaining elements among the field plates FP11 to FP15 instead of the capacitative elements CAP1 to CAP4. As shown in FIG. 6, the anode electrodes of the zener diodes D1 to D4 are connected to the field plates on the side of the gate electrode terminal 61, and the cathode electrodes thereof are connected to the field plates on the side of the drain electrode terminal 51.

Figure 7:
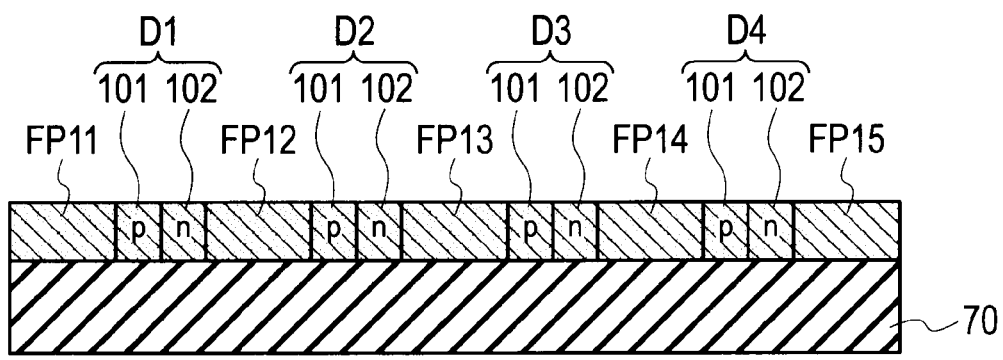
FIG. 7 is a schematic cross-sectional view showing an example of a structure of a voltage dividing element of the semiconductor device shown in FIG. 6.

As illustrated in FIG. 7, the zener diodes D1 to D4 are formed by, for example, locating p-type semiconductor layers 101 and n-type semiconductor layers 102 made of a polysilicon film between each of the field plates FP11 to FP15 on the field insulation film 70.

Instead of the zener diodes, diodes composed by using various transistors such as MOS, JFET, NPN, PNP, and TFT may be used as the charge transfer limiting element 90.

Second Modification

Figure 8:
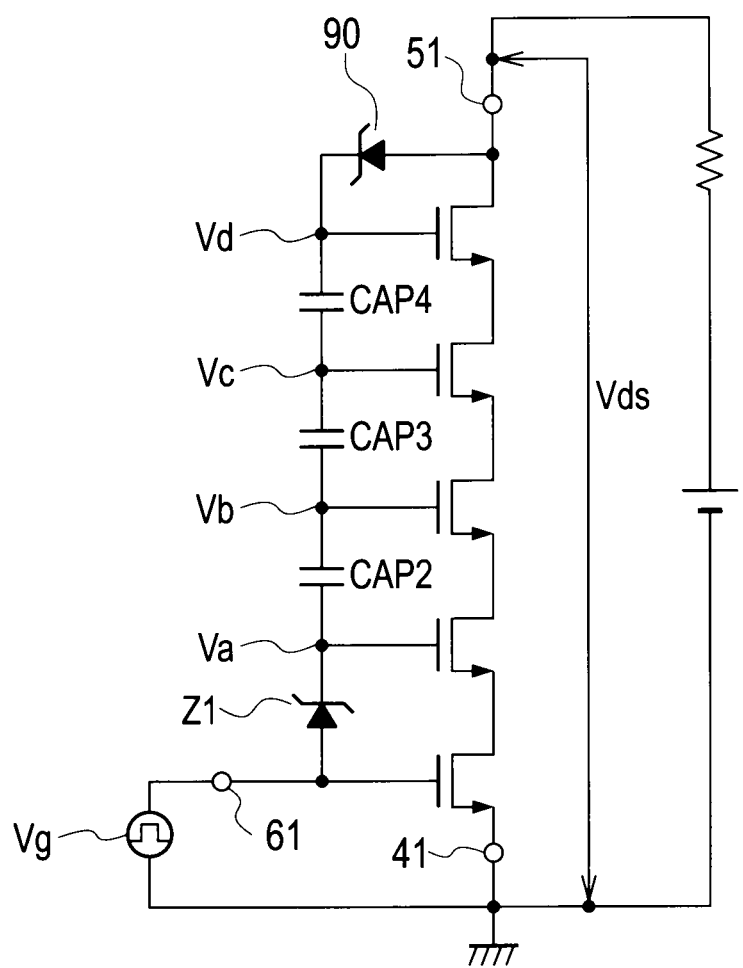
FIG. 8 is a schematic view showing an equivalent circuit of a semiconductor device according to the second modification of the first embodiment of the present invention.

As shown in FIG. 8, a zener diode Z1 may be located in which an anode electrode thereof is electrically connected to a field plate FP11 and a cathode electrode thereof is electrically connected to a field plate FP12. Thus, a divided voltage Va becomes a value which is obtained by adding a forward voltage Vf of the zener diode Z1 to a voltage value of a gate electrode 60. This means that the lowest values of the divided voltages Va to Vc can be increased, thus enabling to create a channel more reliably on the surface of a first semiconductor region 20 immediately beneath a field insulation film 70.

Instead of the zener diode Z1, a diode composed by using various transistors such as MOS, JFET, NPN, PNP, and TFT may be used. Also, the zener diodes may be used instead of capacitative elements CAP2 to CAP4.

Second Embodiment

Figure 9:
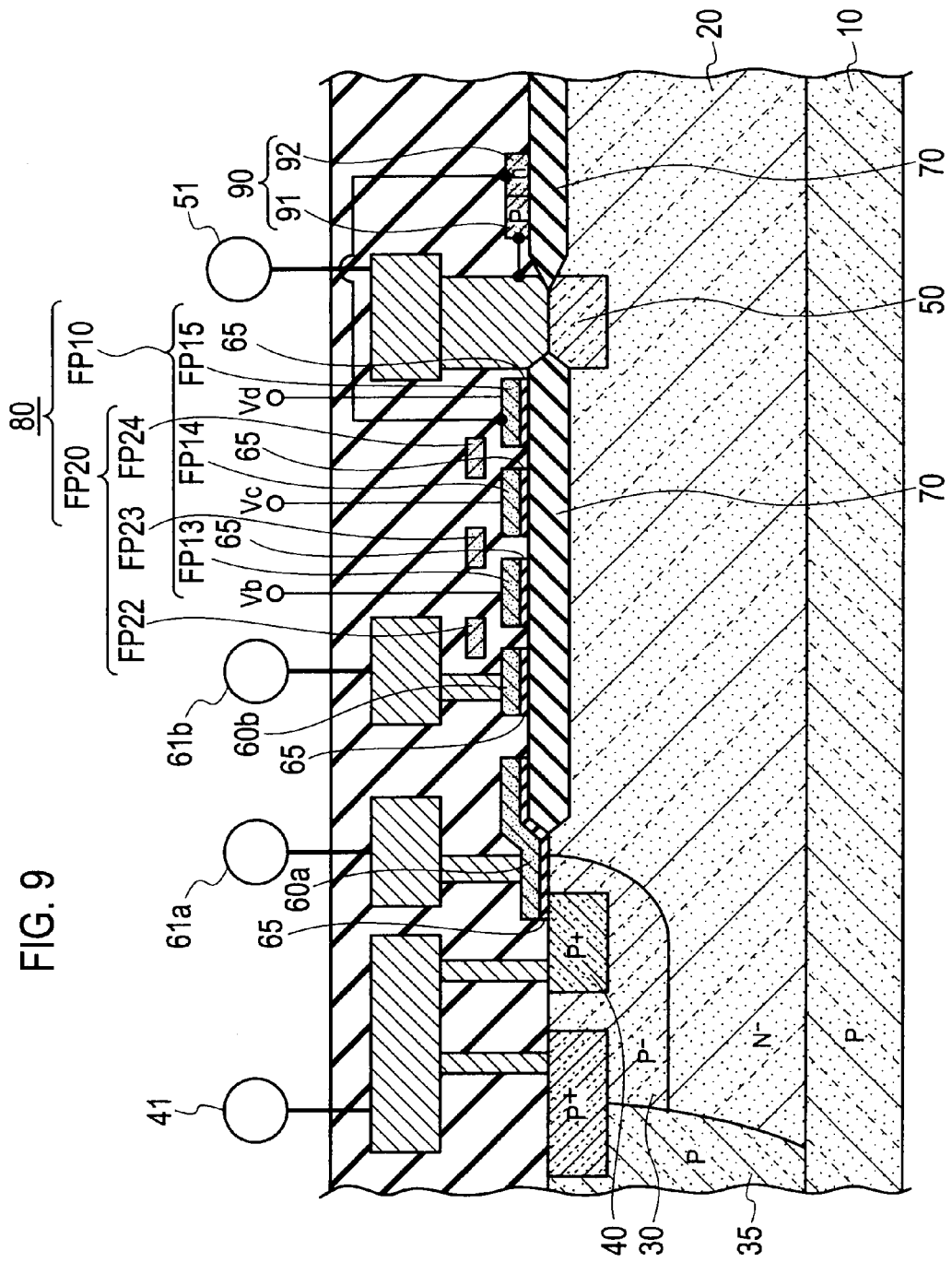
FIG. 9 is a schematic cross-sectional view showing a structure of a semiconductor device according to an second embodiment of the present invention.
Figure 10:
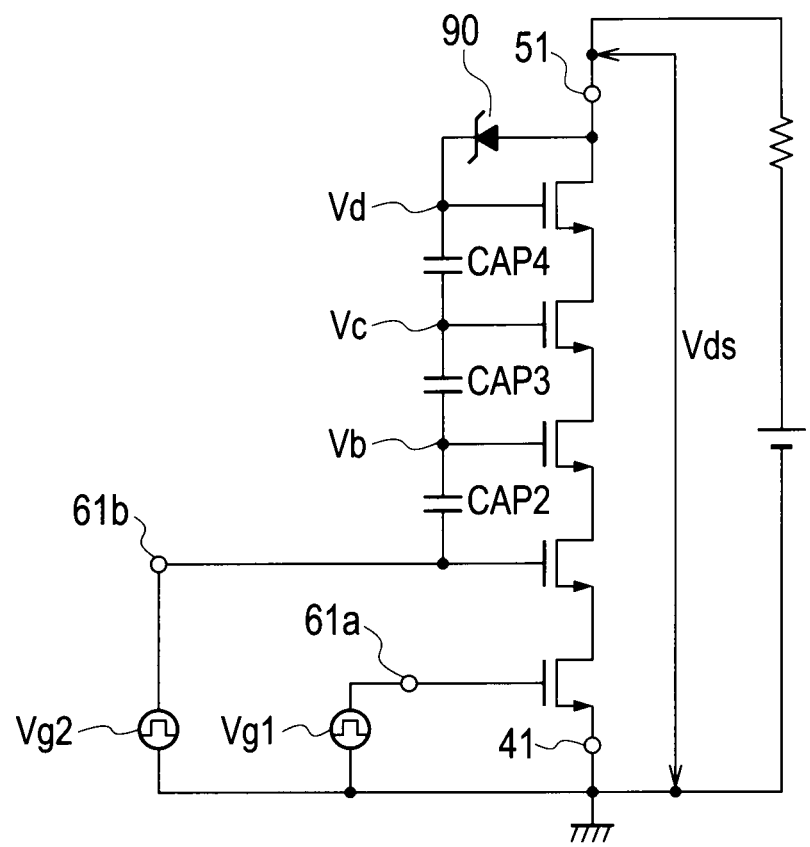
FIG. 10 is a schematic view showing an equivalent circuit of the semiconductor device according to the second embodiment of the present invention.

As illustrated in FIG. 9, a semiconductor device 1 according to the second embodiment of the present invention has a double-gate electrode structure having a second gate electrode 60b in addition to a first gate electrode 60a. More specifically, the field plates FP11 and FP21 are not provided, and the second gate electrode 60b is provided as a substitute for the field plate FP12. The rest of the structure is the same as the first embodiment shown in FIG. 1. FIG. 10 shows the equivalent circuit diagram of the semiconductor device 1 depicted in FIG. 9.

A gate electrode 60a of the semiconductor device 1 shown in FIG. 9 has the same structure as the gate electrode 60 of the semiconductor device 1 shown in FIG. 1. The second gate electrode 60b is located away from the first gate electrode 60a on the drain side of the first gate electrode 60a. A gate voltage Vg2 is applied to a second gate electrode terminal 61b independently from a first gate electrode terminal 61a to which a gate voltage Vg1 is applied.

As with the field plate FP12 of the semiconductor device 1 shown in FIG. 1, a voltage is applied to a first semiconductor region 20 by the second gate electrode 60b on the opposite side through a field insulation film 70. In short, the gate voltage Vg2 is generated in the first semiconductor region 20 instead of the divided voltage Va. Also, divided voltages Vb and Vc obtained by diving the voltage between the voltage Vd of the field plate FP15 and the gate voltage Vg2 are generated in the field plates FP13 and FP14.

Any value of the second gate voltage Vg2 can be applied to the second gate electrode terminal 61*b*. Therefore, the lowest values of the divided voltages can be increased, thus enabling to create a channel more reliably on the surface of the first semiconductor region 20 immediately beneath a field insulation film 70.

Since the field insulation film 70 has a large film thickness, the parasitic capacitance connected to the second gate electrode 60*b* is small. Hence, the second gate electrode terminal 61*b* may be drawn out and driven by using a charge pump circuit or the like.

The rest is practically the same as the first embodiment, so the description thereof is omitted in order to avoid repetition.

The charge transfer limiting element 90 may be connected to the field plate which is closest to the drain region 50 (for example, the field plate FP14) and the drain region 50, or between a plurality of field plates (for example, between the field plates FP14 and FP15).

Further, the field plates FP21 to FP24 may be omitted by constructing the capacitative elements CAP1 to CAP4 only with the field plates FP11 to FP15.

Various modifications will become possible for those skilled in the art after receiving the teachings of the present disclosure without departing from the scope thereof. That is, the semiconductor device according to the embodiments of the present invention can be applied to various lateral transistors that consist of materials such as Si, SiC and GaN.

What is claimed is:

1. A semiconductor device, comprising:
   a second conductive type first semiconductor region;
   a first conductive type second semiconductor region embedded in a part of an upper surface of the first semiconductor region;
   a second conductive type source region embedded in a part of an upper surface of the second semiconductor region;
   a second conductive type drain region embedded in a part of the upper surface of the first semiconductor region separated from the second semiconductor region;
   a gate electrode located on the second semiconductor region between the source region and the drain region;
   an insulation film located on the first semiconductor region between the second semiconductor region and the drain region;
   a voltage dividing element which is located on the insulation film and configured to divide a voltage between the gate electrode and the drain region; and
   a charge transfer limiting element connected between the voltage dividing element and the drain region and configured to limit transfer of charge from the voltage dividing element to the drain region.

2. The semiconductor device according to claim 1, wherein the charge transfer limiting element limits transfer of the charge from the voltage dividing element to the drain region during conduction between the source region and the drain region so as to have the voltage dividing element retain charge, and does not limit transfer of the charge while there is no conduction between the source region and the drain region.

3. The semiconductor device according to claim 1, wherein the charge transfer limiting element is a zener diode in which an anode electrode thereof is connected to the drain region and a cathode electrode thereof is connected to the voltage dividing element.

4. The semiconductor device according to claim 1, wherein the voltage dividing element comprises:
   a plurality of field plates which are separated from each other and arranged from the second semiconductor region toward the drain region above the insulation film; and
   charge retaining elements respectively formed between the neighboring field plates.

5. The semiconductor device according to claim 4, wherein the plurality of field plates includes:
   a first field plate row including a first plurality of field plates located away from each other on the insulation film; and
   a second field plate row including a second plurality of field plates located away from each other on a same plane above the first field plate row so as to cover gaps among the first plurality of field plates of the first field plate row.

6. A semiconductor device, comprising:
   a substrate;
   a source region provided in a part of an upper surface of the substrate;
   a drain region provided in a part of the upper surface of the substrate separated from the source region;
   a gate electrode located on the substrate between the source region and the drain region;
   an insulation film located on the upper surface of the substrate between the gate electrode and the drain region;
   a voltage dividing element which is located on the insulation film and configured to divide a voltage between the gate electrode and the drain region; and
   a charge transfer limiting element connected between the voltage dividing element and the drain region and configured to limit transfer of charge from the voltage dividing element to the drain region.

* * * * *